US006682973B1

(12) United States Patent
Paton et al.

(10) Patent No.: US 6,682,973 B1
(45) Date of Patent: Jan. 27, 2004

(54) FORMATION OF WELL-CONTROLLED THIN SIO, SIN, SION LAYER FOR MULTILAYER HIGH-K DIELECTRIC APPLICATIONS

(75) Inventors: Eric N. Paton, Morgan Hill, CA (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 10 days.

(21) Appl. No.: 10/147,650

(22) Filed: May 16, 2002

(51) Int. Cl.[7] .................... H01L 21/8242; H01L 21/00; H01L 29/76; H01L 29/94

(52) U.S. Cl. .......................... 438/240; 438/3; 257/295; 257/310

(58) Field of Search .................... 438/3, 240; 257/295, 257/310

(56) References Cited

U.S. PATENT DOCUMENTS 6,210,999 B1 4/2001 Gardner et al. ............ 438/183
6,291,866 B1 9/2001 Wallace et al. ............ 257/410
6,291,867 B1 9/2001 Wallace et al. ............ 257/410
6,319,759 B1 * 11/2001 Furukawa et al. .......... 438/151
2002/0137317 A1 * 9/2002 Kaushik et al. ............ 438/585

OTHER PUBLICATIONS

Copending commonly assigned U.S. application No. 10/085,318, filed Feb. 27, 2002.

* cited by examiner

*Primary Examiner*—Caridad Everhart
*Assistant Examiner*—Chuong A Luu
(74) *Attorney, Agent, or Firm*—Renner, Otto, Boisselle & Sklar, LLP

(57) ABSTRACT

A process for fabricating a semiconductor device having a high-K dielectric layer over a silicon substrate, including steps of growing on the silicon substrate an interfacial layer of a silicon-containing dielectric material; and depositing on the interfacial layer a layer comprising at least one high-K dielectric material, in which the interfacial layer is grown by laser excitation of the silicon substrate in the presence of oxygen, nitrous oxide, nitric oxide, ammonia or a mixture of two or more thereof. In one embodiment, the silicon-containing material is silicon dioxide, silicon nitride, silicon oxynitride or a mixture thereof.

18 Claims, 3 Drawing Sheets

FORMATION OF WELL-CONTROLLED THIN SIO, SIN, SION LAYER FOR MULTILAYER HIGH-K DIELECTRIC APPLICATIONS

TECHNICAL FIELD

The invention relates generally to the fabrication of semiconductor devices and, more particularly, to the fabrication of an interfacial layer in devices with a high-K dielectric material layer on a silicon substrate.

BACKGROUND ART

Fabrication of a semiconductor device and an integrated circuit including the same begins with a semiconductor substrate and employs film formation, ion implantation, photolithographic, etching and deposition techniques to form various structural features in or on the semiconductor substrate to attain individual circuit components which are then interconnected to form ultimately an integrated circuit. Escalating requirements for high densification and performance associated with ultra large-scale integration (ULSI) circuits requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integrated circuits employing high performance metal-oxide-semiconductor (MOS) devices. MOS devices typically comprise a pair of ion implanted source/drain regions in a semiconductor substrate and a channel region separating the source/drain regions. Above the channel region is typically a thin gate dielectric material, which is usually referred to as a gate oxide since it is conventionally formed of silicon dioxide, and a conductive gate comprising conductive polysilicon or another conductive material. In a typical integrated circuit, a plurality of MOS devices of different conductivity types, such as n-type and p-type, and complementary MOS (CMOS) devices employing both p-type and n-type devices are formed on a common substrate. MOS technology offers advantages of significantly reduced power density and dissipation as well as reliability, circuit performance and cost advantages.

The drive towards increased miniaturization and the resultant limits of conventional gate oxide layers have served as an impetus for the development of newer, high dielectric constant ("high-K") materials as substitutes for conventional silicon dioxide-based gate oxide layers. Since the drain current in a MOS device is inversely proportional to the gate oxide thickness, the gate oxide is typically made as thin as possible commensurate with the material's breakdown field and reliability. A device in which high-K dielectric materials may be useful is the MIRRORBIT™ flash memory cell available from Advanced Micro Devices, Inc., Sunnyvale, Calif.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-k dielectric materials are being substituted for oxide as the gate dielectric. Herein, a high-K gate oxide may be referred to as a high-K gate dielectric material layer, in order to emphasize that the gate dielectric comprises a high-K dielectric material rather than silicon dioxide.

One problem which has been encountered in integrating high-K dielectric materials into MOS devices, and other semiconductor devices such as EEPROMs and other flash memory devices, is the undesirable interaction between many high-K dielectric materials and the silicon used in other semiconductor device structures, or the undesirable interaction between the reaction conditions used to form high-K dielectric materials and the silicon, polysilicon or polysilicon-germanium upon which the high-K layer is formed. Of particular concern is the interaction between the silicon typically used for the semiconductor wafer and the high-K material used for the high-K gate dielectric material. In addition, of concern is the interaction between the polysilicon or polysilicon-germanium which may be used in a flash memory device and the high-K material which is formed thereover. Such undesirable interactions could be observed, for example, in SONOS-type devices and in floating gate flash memory cells.

One of the undesirable interactions which may occur is the uncontrolled oxidation of the silicon, polysilicon or polysilicon-germanium material in contact with a high-K gate dielectric material layer by oxidizing species used in forming the high-k dielectric material layer, and by the oxygen in the metal oxides of which most high-K dielectric materials are formed. Such oxides may be formed in addition to native oxide on the silicon surface and may form more readily when a native oxide is present. These interactions, and the native oxide, either lead to an undesirably thick oxide interface at the silicon-high-K interface, or lead to degradation of the K value of the high-K dielectric material by formation of a composite dielectric material having a K value lower than desired. In both cases, the overall equivalent oxide thickness of the gate dielectric is reduced.

Hence, it would be highly advantageous to develop a process that would permit the use of optimum materials in the formation of a high-K gate dielectric material, without the problems which result from oxidation of silicon, polysilicon or polysilicon-germanium upon which the high-K dielectric material is deposited. Accordingly, there exists a need for a process of forming a high-K dielectric material over a silicon, polysilicon or polysilicon-germanium substrate, while avoiding or minimizing oxidation or interaction of high-K dielectric material with the silicon, polysilicon or polysilicon-germanium substrate.

DISCLOSURE OF INVENTION

In one embodiment, the present invention relates to a process for fabricating a semiconductor device having a high-K dielectric layer over a silicon substrate, including steps of growing on the silicon substrate an interfacial layer of a silicon-containing dielectric material; and depositing on the interfacial layer a layer comprising at least one high-K dielectric material, in which the interfacial layer is grown by laser excitation of the silicon substrate in the presence of oxygen, nitrous oxide, nitric oxide, ammonia or a mixture of two or more thereof.

In another embodiment, the present invention relates to a process for fabricating a semiconductor device having a high-K dielectric layer over a silicon substrate, including steps of growing on the silicon substrate an interfacial layer of a dielectric material comprising silicon dioxide, silicon nitride, silicon oxynitride or a mixture thereof; and depositing on the interfacial layer by ALCVD, RTCVD or MOCVD a layer comprising at least one high-K dielectric material, in which the interfacial layer is grown by laser excitation of the silicon substrate in the presence of oxygen, nitrous oxide, nitric oxide, ammonia or a mixture of two or more thereof.

In another embodiment, an interfacial barrier layer may be deposited on the high-K dielectric material layer, after the high-K dielectric material layer has been deposited on the interfacial layer.

Following deposition of the foregoing layers, a polysilicon or polysilicon-germanium gate electrode layer may be deposited thereon. The polysilicon or polysilicon-germanium gate electrode layer may be deposited either directly on the high-K dielectric material layer or on the interfacial barrier layer deposited on the high-K dielectric material layer.

Thus, the present invention provides a solution to the problem of forming a high-K dielectric material layer on a silicon substrate or of forming a polysilicon gate electrode on a high-K dielectric material layer without oxidation of the silicon, polysilicon or polysilicon-germanium.

Figure 1:
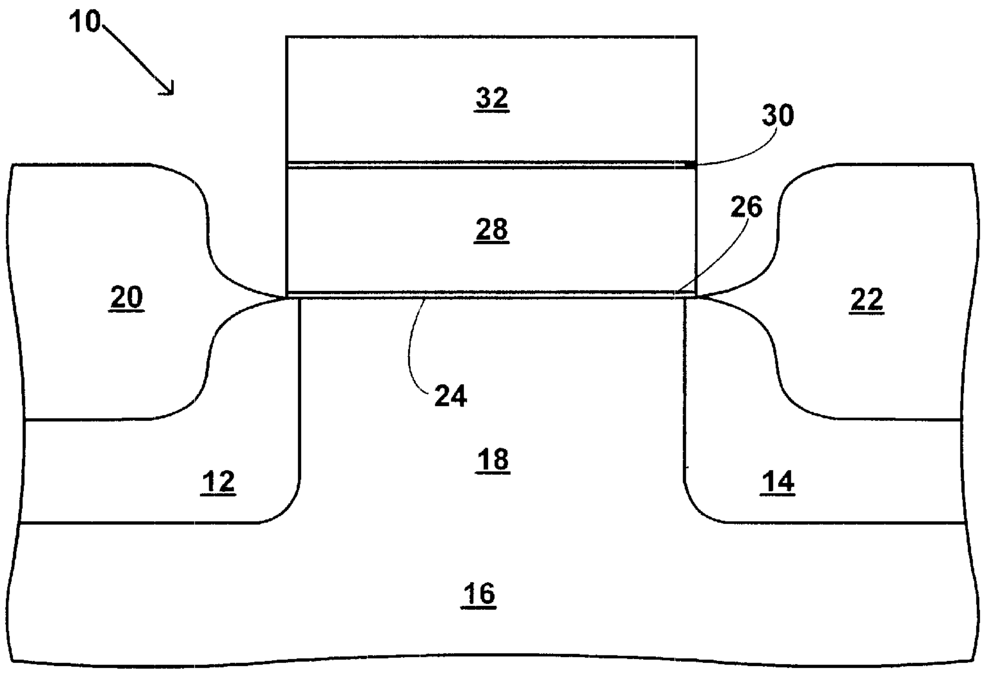
FIG. 1 is a schematic cross-sectional view of an exemplary MOS structure in accordance with the present invention.

It should be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

MODES FOR CARRYING OUT THE INVENTION

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, silicon nitride, which has a K of about 6–9, and aluminum oxide, which has a K of about 10.

As used herein, the term "high-K dielectric material" refers to a dielectric material having a K greater than about 10. Such high-K dielectric materials include, for example, $HfO_2$, $ZrO_2$ and others known in the art, some of which are specifically identified more fully below. In general, the term "high-K dielectric material" encompasses binary, ternary and higher dielectric oxides and any ferroelectric material having a K of about 10 or more. High-K dielectric materials may also include, for example, composite dielectric materials such as hafnium silicate, which has a K of about 14, a and hafnium silicon nitride, which has a K of about 18.

As used herein, the term "composite dielectric material" refers to a dielectric material comprising the elements of at least two other dielectric materials. A composite dielectric material generally has a K value as defined above for a high-K dielectric material. As described in more detail below, a composite dielectric material may be formed by co-deposition of its component elements, or by sequential deposition followed by a treatment step, e.g., thermal treatment, to combine the elements to form the composite dielectric material.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Using a high-K dielectric material, e.g., for a gate dielectric layer, allows a low electrical thickness to be achieved while retaining a physically thick layer. For example, a high-K dielectric material layer with a K of 40 and a thickness of 100 angstroms (Å) is substantially electrically equivalent to a silicon dioxide layer (K about 4) having a thickness of about 10 Å. The electrically equivalent thickness of a high-K dielectric material layer may be referred to in terms of the equivalent oxide thickness of a layer of silicon dioxide. Thus, a high-K dielectric material layer having a K of 40 and a given physical thickness has an equivalent oxide thickness which is approximately 1/10 the given physical thickness. For high-K dielectric materials, reliably thick dielectric material layers can be formed while maintaining equivalent oxide thickness values lower than are possible with unreliably thin silicon dioxide layers. In this way, the reliability problems associated with very thin dielectric layers may be avoided while transistor performance is increased.

Approximate K-values or, in some cases, a range of K-values, are shown below in Table 1 for several exemplary dielectric materials. It is understood that the present invention is not limited to the specific dielectric materials disclosed herein, but may include any appropriate standard-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| hafnium aluminate | 12–20 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |

TABLE 1-continued

| Dielectric Material | Approximate Dielectric Constant (K) (Relative Permittivity) |
|---|---|
| $BaTiO_3$ | ~20—200 |
| $SrTiO_3$ | ~20—200 |
| $PbZrO_3$ | ~20—200 |
| PST ($PbSc_xTa_{1-x}O_3$) | ~20—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a high-K dielectric material may be used adjacent to the silicon surface of a semiconductor substrate or adjacent to a silicon or polysilicon surface. For example, a polysilicon gate electrode in a FET, in a polysilicon floating gate electrode EEPROM flash memory device, in a two-bit flash memory device, such as the MIRROR-BIT™ flash memory device available from Advanced Micro Devices, Sunnyvale, Calif. In general, the invention is applicable to any device having a high-K dielectric material layer which is to be formed in contact with silicon, polysilicon or polysilicon-germanium in which it is desired to avoid oxidation of the silicon, polysilicon or polysilicon-germanium by the high-K dielectric material or by processes used for its deposition. For devices in which high-K dielectric materials are used, the present invention minimizes or avoids the uncontrolled growth of interfacial silicon dioxide and reduces the interaction of the high-K dielectric material with the silicon, polysilicon or polysilicon-germanium adjacent to the high-K dielectric material layer. Thus, it is to be understood that the present invention is not limited to the specific illustrative embodiments described below.

In one embodiment, the present invention relates to a process of fabricating the semiconductor device, in which the semiconductor device includes a semiconductor substrate, a polysilicon or polysilicon-germanium gate electrode and a high-K gate dielectric material layer separating the polysilicon or polysilicon-germanium gate electrode from the semiconductor device surface. In the process a well-controlled, thin interfacial layer is grown on the silicon substrate prior to deposition of the high-K dielectric material layer. In one embodiment, in addition to the interfacial layer on which the high-K dielectric material is formed, an interfacial barrier layer is deposited on the high-K dielectric material layer, between the high-K layer and the overlying gate electrode. The interfacial layer may include one or more of, for example, silicon dioxide, silicon nitride or silicon oxynitride. In one embodiment, when the interfacial layer is silicon oxynitride, silicon nitride or a mixture thereof, the high-K dielectric material layer is not a metal oxynitride.

Referring first to FIG. 1, there is schematically shown in cross-section a field effect transistor (FET) 10 such as that used in a CMOS device. The transistor 10 includes source/drain regions 12 and 14 located in a semiconductor substrate 16 and separated by a channel region 18. First and second bit line oxide regions 20 and 22 overlie source/drain regions 12 and 14, respectively. In contact with an upper surface 24 of the silicon substrate 16 is a first interfacial layer 26. A layer 28 comprising a high-K dielectric material overlies the first interfacial layer 26. An interfacial barrier layer 30 overlies the layer 28 comprising a high-K dielectric material. Finally a gate electrode 32 overlies the interfacial barrier layer 30. Thus, the interfacial layer 26 and the interfacial barrier layer 30 separate the layer 28 comprising a high-K dielectric material from the silicon substrate 16 and from the gate electrode 32. The gate electrode 32 may be formed of, for example, polysilicon or polysilicon-germanium, or may be formed of a metal or a silicide, as known in the art, or by any other appropriate material known in the art. The interfacial barrier layer 30 may not be needed if the gate electrode 32 is formed of a material which is not susceptible to oxidation by the high-K dielectric material layer 28, or which does not significantly interact with the high-K dielectric material.

Not shown in FIG. 1 are additional parts of a working semiconductor device, such as electrical conductors, interlayer dielectric layer, contacts and other parts of the structure which would be included in a complete, working semiconductor device. These additional parts are not germane to the present invention, and for simplicity and brevity are neither shown nor described, but could be easily added as will be understood by those of skill in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped or an n-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate, except that it is primarily directed to a semiconductor substrate or layer having a silicon, polysilicon or polysilicon-germanium surface. In general, for purposes of the present invention, reference to a silicon surface is intended to refer to any of a silicon surface (monocrystalline or amorphous), a polysilicon surface, or a polysilicon-germanium surface, unless otherwise specifically stated.

The present invention further relates to a process of making the above-described semiconductor device.

Additional details of the process of the present invention are set forth below. The specific examples provided herein are intended to explain the invention, but are not intended to limit the scope of the invention, which is defined by the attached claims.

Figure 2:
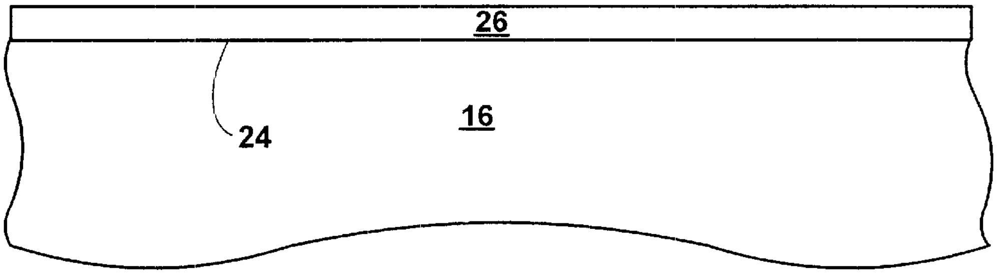
FIGS. 2–5 are schematic cross-sectional views of steps of fabricating a semiconductor substrate comprising an interfacial dielectric material layer and a high-K dielectric material layer in accordance with an embodiment of the present invention.
Figure 6:
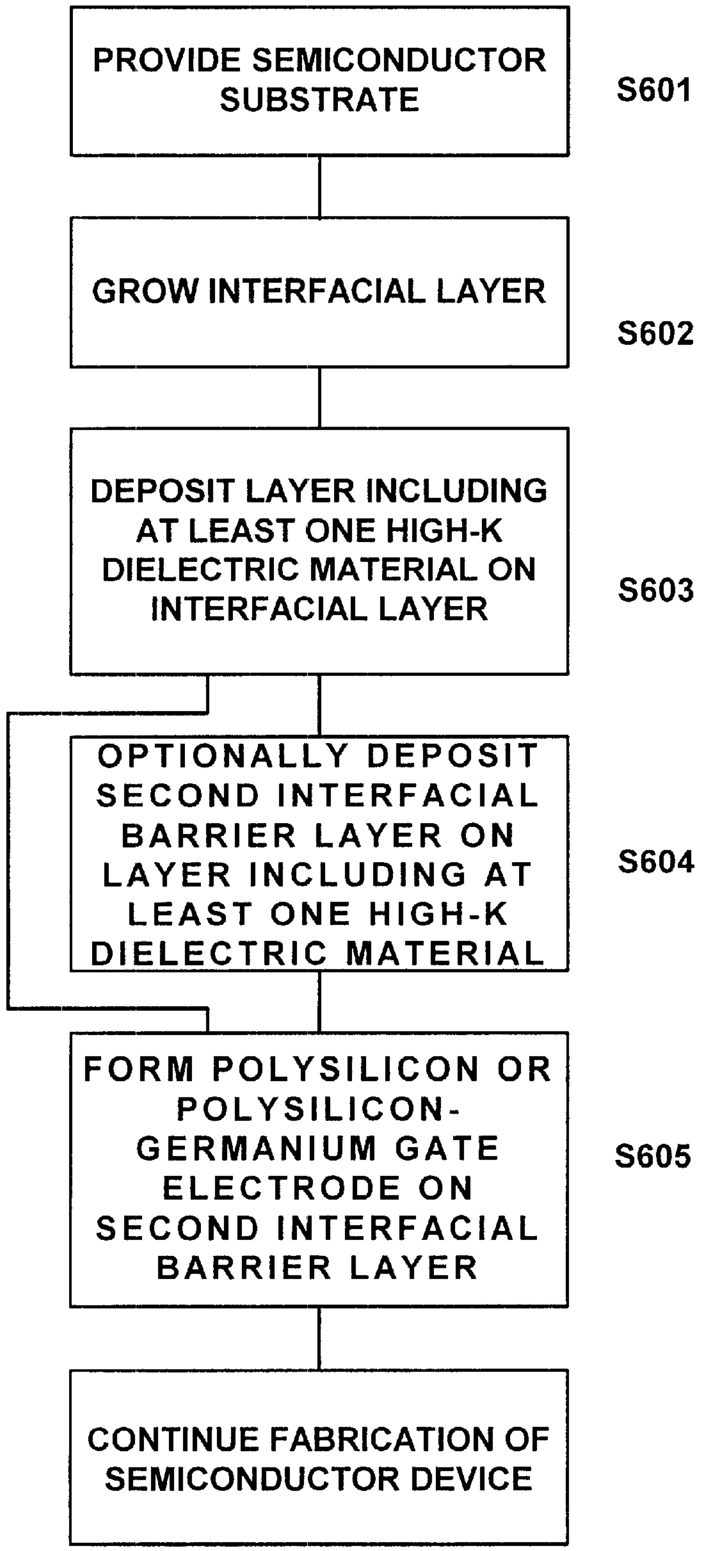
FIG. 6 is a schematic flow diagram showing the basic steps in a process of fabricating a semiconductor device in accordance with the present invention.

In the first step of the process of the present invention, shown in FIG. 6 as Step S601, a semiconductor substrate 16 is provided, as shown in, e.g., FIG. 2. The semiconductor substrate may be any appropriately selected semiconductor substrate known in the art, as described above. The semiconductor substrate 16 includes a surface 24, shown in FIGS. 1 and 2. In one embodiment, the surface 24 is silicon, and in another embodiment, the surface 24 is polysilicon, and in another polysilicon-germanium.

In the second step of the process of the present invention, shown in FIG. 6 as Step S602, an interfacial layer 26 is grown on the surface 24. FIG. 2 shows an embodiment of the semiconductor substrate 16 after growing the interfacial layer 26 on the surface 24.

In one embodiment, prior to growing the interfacial layer 26, the surface 24 is cleaned to remove any contaminants and to remove any native oxides or any other passivating material (such as hydrogen) which may have been formed thereon. Suitable methods for such cleaning and removal are known in the art.

In one embodiment, the interfacial layer 26 comprises silicon dioxide ($SiO_2$), silicon nitride ($Si_3N_4$), silicon oxynitride ($Si_wO_xN_y$), or mixtures thereof. It is noted that silicon oxynitride may include hydrogen, and so the formula may be written as $Si_wO_xN_yH_z$, in which w, x, y and z vary depending on formation conditions. Silicon dioxide may also be referred to as "oxide" or as SiO. Silicon nitride may also be referred to as "nitride" or as SiN. Silicon oxynitride also may be referred to as SiON. Mixtures of these materials including a chemical composite are within the scope of the present invention. As will be recognized, while it may be possible to form a composite or mixture of SiN and SiO, such a mixture may be indistinguishable from silicon oxynitride. As will become more clear below, while it may be feasible to grow a plurality of interfacial layers, it is desirable to form a minimally thick layer, such as a molecular monolayer of the interfacial material, whether it is SiO, SiN or SiON.

In one embodiment, the first interfacial layer 26 may be grown by a laser excitation process in an atmosphere containing an appropriate reactive agent for formation of the desired interfacial layer. In one embodiment, the laser is an ultraviolet (UV) laser; in one embodiment the laser is pulsed; and in one embodiment, the laser is a pulsed UV laser.

Use of a laser for excitation of the reactive species and the silicon, polysilicon or polysilicon-germanium substrate has a number of advantages. The primary advantage is that the power, timing and wavelength, i.e., the energy output, laser may be controlled precisely to obtain exactly the desired extent and rate of reaction between the reactive species and the substrate. In addition, use of the laser in conjunction with the close control of the reactive species provides a level of control which allows formation of a well-controlled, thin SiO, SiN or SiON layer. By controlling the pressure, flow and identity of the reactive species, and by selection of the power, timing and wavelength of the laser, a controlled thickness interfacial layer can be formed having a desired composition.

The laser excitation includes irradiating at least a portion of a silicon surface in the presence of a reactive species, in which the irradiating is conducted with a laser, in one embodiment an ultraviolet (UV) laser, in one embodiment a pulsed UV laser. The irradiating is conducted for a period of time and at an energy density which is sufficient to excite the reactive species to react with the silicon surface to form the desired interfacial layer. The reactive species is an oxygen-containing species or a nitrogen-containing species, or a combination of these, which is reactive with silicon, polysilicon or polysilicon-germanium under the laser excitation conditions. The reactive species includes one or more of oxygen ($O_2$), nitrous oxide ($N_2O$), nitric oxide (NO), ammonia ($NH_3$), or a mixture of two or more of these.

An energy density "sufficient to excite the reactive species" means that the energy density is below the melting temperature of the silicon, polysilicon or polysilicon-germanium surface being irradiated, but is sufficient to excite the reactive species and the surface so that the reactive species will react with the silicon, polysilicon or polysilicon-germanium. Energy densities high enough to cause melting or ablation of the silicon surface are not desired, and would be expected to adversely affect properties of the silicon, such as the crystallinity. Energy densities need only be sufficient to cause a controllable reaction of the reactive species with the silicon, polysilicon or polysilicon-germanium surface.

The number of pulses and energy density which are selected to activate the silicon, polysilicon or polysilicon-germanium surface may be effective to produce localized excitation of the surface down to a about 1 to about 5 Angstroms (Å) into the silicon, polysilicon or polysilicon-germanium substrate, although deeper reaction may be effected. Accordingly, the energy density ($E_d$) used to activate the silicon surface should be below the melting-threshold energy density ($E_{dth}$) for the silicon surface to be activated, in order to avoid melting and associated changes in crystallinity. In the case of silicon, the $E_{dth}$ for a pulsed-laser is about 0.5 J/cm$^2$.

The irradiation may be carried out by any suitable laser. In one embodiment, the laser is a UV laser, i.e., the light output is in the UV wavelength range, at a wavelength in the range from about 190 nm to about 400 nm. In one embodiment, a pulsed laser is used. Examples of such lasers which may be used to activate a silicon surface include pulsed excimer lasers (for example, XeCl, KrF, or ArF operating at photon energies of 4, 0, 5.0 and 6.4 electron volts, respectively), frequency tripled or quadrupled Nd:YAG, ruby, Nd:glass, excimer, and $CO_2$ or other similar pulsed visible lasers from which pulsed ultraviolet light can be produced by optical harmonic generation. As understood by those skilled in the art, the $E_d$ level and the number of pulses may be adjusted for a given laser and silicon surface material (e.g., whether monocrystalline silicon, polycrystalline silicon, or polysilicon-germanium) for activation thereof.

The laser will normally be focused to provide the required energy density. For activating the silicon surface and the reactive specie(s), the type of laser is not critical, provided that its energy can be coupled into (absorbed within) a very shallow near-surface region. A very shallow surface region is defined as a region up to about 5 Angstroms (Å). Consequently, it is important that the number of laser pulses and the focused laser energy density, $E_d$ be appropriately selected or sufficient to provide excitation only in the thin treating area and/or depth desired and not beyond. For example, for the case of an XeCI laser, and silicon substrates, the maximum $E_d$ is about 0.5 J/cm$^2$ in an oxidizing atmosphere and the optimum number of pulses N is between about and about 5 and about 20. Using the XeCl laser, good activation may be obtained with $E_d$ values much lower than the maximum $E_d$ values suitable for surface activation. For example, $E_d$ ranging from about 0.2 to about 1.5 J/cm$^2$ may effectively activate a polycrystalline silicon surface for reaction with oxygen or nitrous oxide, while a slightly higher energy may be required for ammonia, due to its lower reactivity relative to oxygen or nitrous oxide.

In one embodiment, the reactive specie(s) is present in gaseous form, at a partial pressure in the range from about 1 mTorr to about 100 mTorr. Such low partial pressure of the reactive specie allows for a greater degree of control of the reaction between the reactive species and the silicon, polysilicon or polysilicon-germanium surface, under the excitation of the laser. Since there is necessarily an excess of the silicon, polysilicon or polysilicon-germanium, the limiting reagent in the reaction should be the reactive species. In one embodiment limitation of the amount of the reactive specie (s) is accomplished by providing the reactive species at a low partial pressure. In one embodiment, the low partial pressure is obtained by providing the reactive specie(s) at a low absolute pressure. In another embodiment, the low partial pressure is obtained by providing the reactive species at a low concentration in a non-reactive diluent gas, such as an inert gas. Suitable inert gases are helium, argon and nitrogen. In another embodiment, the reactive specie(s) is provided at a low concentration in a non-reactive diluent gas, the gas mixture is provided at a low absolute pressure. In general, the partial pressure of the reactive specie(s) may be adjusted according to factors such as the chemical reactivity of the reactive species, laser-related factors such as the energy, type, wavelength, pulse timing and pulse length, the chemical reactivity and crystal form and orientation of the substrate, and the desired thickness of the interfacial layer to be formed.

The reactive species may be provided at a suitable flow rate, so that the selected partial pressure thereof is maintained throughout the period of laser excitation.

The laser excitation may be carried out for a suitable period of time. In one embodiment, the laser is scanned over the surface of the substrate at a rate selected to provide the desired excitation without excessive excitation, which might result in formation of a too-thick interfacial layer. A suitable scan speed may be determined based on the energy level available from the particular laser actually used. Some experimentation may be needed in order to optimize the energy level, scan speed and time, for a given reactive species and pressure thereof and for a given substrate.

The laser excitation may be carried out at any suitable temperature. Since the laser provides the excitation energy, it is not necessary to provide a heated environment for the reaction.

The interfacial barrier layer 26 is grown, in one embodiment, to a thickness in the range from about 1 angstrom (Å) to about 5 Å. In another embodiment, the thickness of the interfacial barrier layer 26 is in the range from about 1 Å to about 3 Å. In another embodiment, the interfacial barrier layer 26 is grown in a monolayer, in which the thickness of the layer is determined by the thickness of a monolayer of the molecules of the material from which the interfacial barrier layer 26 is formed. For example, the thickness of a monolayer of silicon nitride is about 1–2 Å. In other embodiments, the thickness of the interfacial barrier layer 26 ranges from one monolayer to several monolayers of the material. Several monolayers means an integral or non-integral multiple (i.e., about 1× to about 5×) of the thickness of a single monolayer.

While thicker interfacial barrier layers are possible, as the thickness of the interfacial barrier layer increases, the overall K value and hence, the equivalent oxide thickness, of the interpoly dielectric or gate dielectric is reduced from the K value of the high-K dielectric material layer which will form the bulk of the interpoly or gate dielectric which is to be formed subsequently. Thus, having an interfacial barrier layer too thick would detract from the benefits of having a high-K dielectric material layer. In addition, when the interfacial layer 26 is grown by means of laser excitation, it is possible to controllably grow layers of single molecular thickness, i.e., a monolayer. Since this thickness is all that is needed to obtain the benefit of the present invention, there is no need to grow a thicker interfacial layer 26.

The interfacial layer 26 is intended to provide a protective barrier over the silicon, polysilicon or polysilicon-germanium surface at the interface with a high-K dielectric material layer which subsequently will be deposited thereon. The silicon, polysilicon or polysilicon-germanium surface would otherwise be directly exposed to the conditions from which the high-K dielectric material layer is formed. As noted in the background, such conditions may result in the uncontrolled oxidation of the silicon, polysilicon or polysilicon-germanium surface, and result in reduction of the K value of the high-K dielectric material layer. The purpose of the interfacial layer is to avoid undesired reactions between the silicon, polysilicon or polysilicon-germanium and the reactants used to deposit the high-K dielectric material which may otherwise occur. Thus, the thickness of the interfacial barrier layer 26 may be minimized, consistent with its barrier function.

Figure 3:
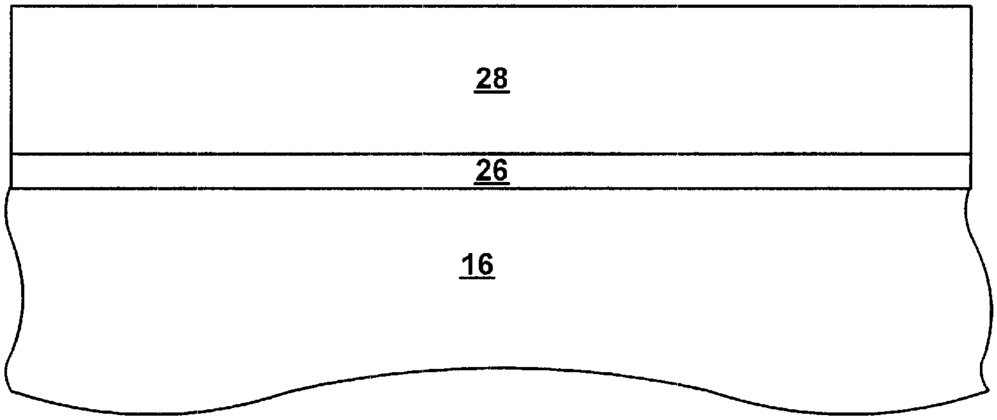

In the third step of the process of the present invention, shown in FIG. 6 as Step S603, a high-K dielectric material layer 28 is deposited on the surface of the interfacial layer 26. FIG. 3 shows an embodiment of the semiconductor substrate 16 after growth of the interfacial layer 26 on the surface 24 and after deposition of a high-K dielectric material layer 28 on the interfacial layer 26.

The high-K dielectric material layer 28 may be deposited on the interfacial layer 26 by any appropriate method known in the art. For example, the high-K dielectric material may be deposited by LPCVD, RTCVD, MOCVD or ALCVD. In addition, the high-K dielectric material may be deposited by PVD or sol-gel deposition techniques.

The high-K dielectric material may comprise any high-K dielectric material which is appropriate for use with the semiconductor device 10 to be fabricated. The high-K dielectric material layer 28 may comprise, for example, any one of a variety of known high-K dielectric materials, such as hafnium oxide, yttrium oxide, lanthanum oxide, and combinations of such high-K dielectric materials with standard-K dielectric materials (e.g., $SiO_2$), such as hafnium silicate, $HfSiO_4$. Suitable exemplary high-K dielectric materials include those disclosed in the above table and associated disclosure.

In one embodiment, the high-K dielectric material includes at least one of $Zro_2$, $HfO_2$, $Al_2O_3$, $Y_2O_3$, $La_2O_3$, silicates of one or more of $ZrO_2$, $HfO_2$,$Al_2O_3$, $Y_2O_3$, $La_2O_3$ or aluminates of one or more of $ZrO_2$, $HfO_2$, $Y_2O_3$, $La_2O_3$. In a embodiment, the high-K dielectric material includes at least one of hafnium oxide ($HfO_2$), zirconium oxide ($Zro_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

In one embodiment, the high-K material is a high-K material other than tantalum oxide ($Ta_2O_5$). Tantalum oxide has been found, in some embodiments, to exhibit an undesirably high leakage current.

In one embodiment, the high-K dielectric material is implanted or doped during deposition with atoms which inhibit recrystallization of the high-K dielectric material. It is preferred that the high-K dielectric material remain amorphous, rather than crystalline and the presence of these atoms inhibits recrystallization. A method of inhibiting the recrystallization of high-K dielectric materials by implantation of one or more dopant species such as nitrogen, silicon, germanium, aluminum or the like has been discovered and is disclosed in copending, commonly assigned U.S. application Ser. No. 10/146,232, filed May 15, 2002 (Attorney Docket No. G0531 (AMDSPG0531US)), entitled RECRYSTALLIZATION INHIBITION BY DOPANT IMPLANTATION. The disclosure of this application is incorporated by reference herein for its teachings relating to implantation of one or more dopant species, for inhibiting recrystallization of the high-K dielectric material. In addition to implantation, the dopant species may be doped into the high-K dielectric material layer during its formation.

In one embodiment, when the interfacial layer 26 is silicon oxynitride or silicon nitride, or a mixture thereof, the high-K dielectric material is not a metal oxynitride or a metal silicon oxynitride. The term "metal oxynitride" as used herein includes both metal oxynitride and metal silicon oxynitride compounds. Metal oxynitrides have the general formula MON or MSiON. The exact stoichiometry varies with the valence of the metal, whether or not silicon is present, and the conditions of formation of the metal oxynitride.

In one embodiment, the high-K dielectric material has a K value in the range from about 10 to about 5000. In another embodiment, the high-K dielectric material has a K value in the range from about 10 to about 500, and in yet another embodiment, the K value is from about 10 to about 50.

FIG. 3 shows the nascent semiconductor device 10 after deposition of a high-K dielectric material layer 28, i.e., at the completion of step S603. Although only a single high-K dielectric material layer 28 is shown in FIG. 3, it is understood that multiple sub-layers may be included in the high-K dielectric material layer 28, as long as the upper surface of the layer 28 comprises a high-K dielectric material.

The fourth step of the process, shown in FIG. 6 as Step S604, is an optional step. That is, this step is not essential to the present invention, and may be bypassed as shown by the line in FIG. 6 connecting step S603 to step S605.

In the step S604, an interfacial barrier layer 30 may be deposited on the high-K dielectric material layer 28. The interfacial barrier layer 30 is optional, since it may not be needed if the gate electrode to be subsequently formed is made of a material which is not susceptible to reaction with the high-K dielectric material which forms the layer 28, or if the conditions under which the subsequently formed gate electrode are such that there is substantially no likelihood of a reaction occurring between the material from which the gate electrode is formed and the high-K dielectric material. For example, if a metal gate electrode is to be used, the interfacial barrier layer 30 may not be needed. As a further example, if the gate electrode is polysilicon which is formed by sputtering or a low-temperature CVD process, the interfacial barrier layer 30 may not be needed.

Figure 4:
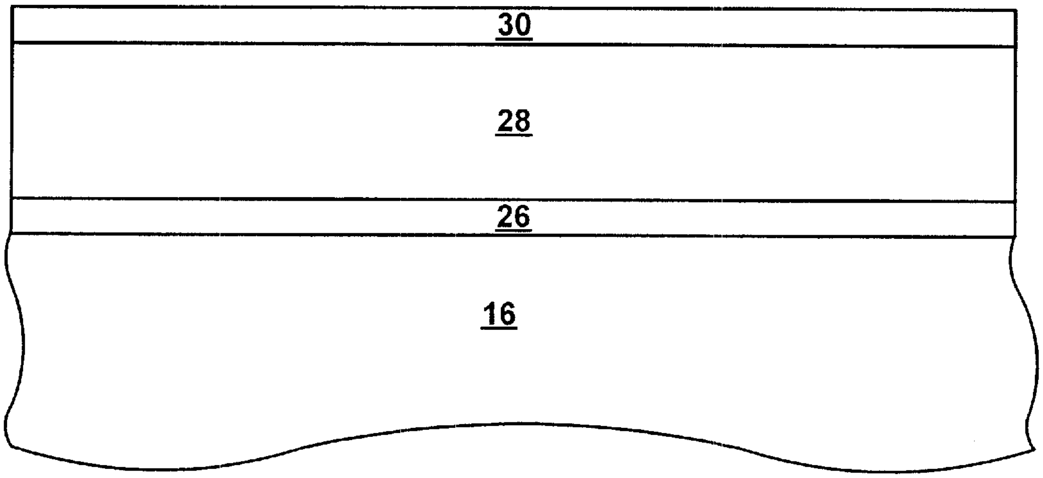

FIG. 4 shows an embodiment of the semiconductor substrate 16 after deposition of an interfacial layer 26 on the surface 24, deposition of the high-K dielectric material layer 28 on the interfacial layer 26, and deposition of the interfacial barrier layer 30 on the high-K dielectric material layer 28.

In one embodiment, the interfacial barrier layer 30 may be deposited by ALCVD, RTCVD, MOCVD or LPCVD. In other embodiments the interfacial barrier layer 30 may be deposited by any method capable of depositing a uniform layer as thin as a monolayer of the material of the interfacial barrier layer 30. While other CVD or physical deposition processes may possibly be used, these other methods are not generally capable of depositing a reliably uniform monolayer, and so are not preferred.

The interfacial barrier layer 30 is deposited, in one embodiment, to a thickness in the range from about 1 angstrom (Å) to about 20 Å. In another embodiment, the thickness of the interfacial barrier layer 30 is in the range from about 1 Å to about 5 Å. In another embodiment, the interfacial barrier layer 30 is deposited in a monolayer, in which the thickness of the layer is determined by the thickness of a monolayer of the molecules of the material from which the interfacial barrier layer 30 is formed. For example, the thickness of a monolayer of aluminum oxide is about 1–2 Å. In other embodiments, the thickness of the interfacial barrier layer 30 ranges from one monolayer to several monolayers of the material. Several monolayers means an integral or non-integral multiple (i.e., about 1× to about 5×) of the thickness of a single monolayer.

While thicker interfacial barrier layers are possible, as the thickness of the interfacial barrier layer increases, the overall K value of the interpoly dielectric or gate dielectric is reduced from the K value of the high-K dielectric material layer which will form the bulk of the interpoly or gate dielectric which is to be formed subsequently. Thus, having an interfacial barrier layer too thick would detract from the benefits of having a high-K dielectric material layer.

The material from which the interfacial barrier layer 30 is formed may be the same as, or may be different from, the material used for the interfacial layer 26. Thus, for example, the interfacial barrier layer 30 may be aluminum oxide, silicon dioxide, silicon nitride, silicon oxynitride or any of the mixtures or composites of these materials.

Figure 5:
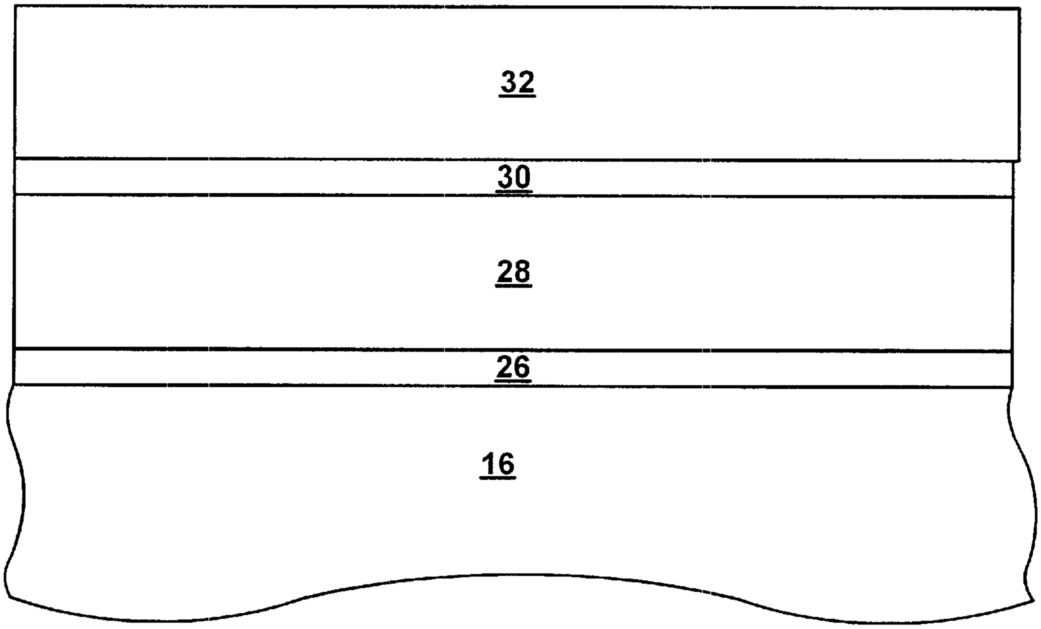

In the fifth step of the process of the present invention, shown in FIG. 6 as Step S605, a gate electrode 32 is deposited on the high-K dielectric material layer 28. The gate electrode 32 may be, e.g., a gate electrode in, e.g., a FET, or it may be a control gate in a flash memory device. FIG. 5 shows an embodiment of the semiconductor substrate 16 after deposition of a gate electrode 32 on the interfacial barrier layer 30.

In the embodiment shown in FIG. 5, the gate electrode 32 may be deposited on the surface of the interfacial barrier layer 30 by any suitable method known in the art. Similarly, in an embodiment in which no interfacial barrier layer is present, the gate electrode 32 may be deposited directly on the high-K dielectric material layer 28 by any suitable process which will avoid a reaction with the high-K dielectric material. Thus, the interfacial barrier layer 30 forms a barrier between the polysilicon of the gate electrode 32 and the high-K dielectric material layer 28.

In one embodiment, the gate electrode 32 is formed from polysilicon or polysilicon-germanium. In another embodiment, the gate electrode 32 is a metal gate, as known in the art. In another embodiment, the gate electrode 32 is a silicide gate, as known in the art.

In one embodiment, when the gate electrode 32 is polysilicon or polysilicon-germanium, the step of depositing the polysilicon or polysilicon-germanium layer 32 is carried out by LPCVD, RTCVD, MOCVD or ALCVD. In one embodiment, the step of depositing a polysilicon or polysilicon-germanium layer is carried out by a plasma CVD process, i.e., PECVD. In one embodiment, the polysilicon or polysilicon-germanium layer 32 is deposited by LPCVD.

Portions of the polysilicon or polysilicon-germanium layer 32, the interfacial barrier layer 30, the interfacial layer 26 and the high-K dielectric material layer 28 will subsequently be etched away, to form the structure shown in FIG. 1. Upon completion of formation of the respective layers and etching back, the semiconductor device 10 shown in FIG. 1 is obtained.

The source region 12 and the drain region 14 may be formed prior to or subsequent to growth of the interfacial layer 26, deposition of the high-K gate dielectric material layer 28, and deposition of the interfacial barrier layer 30, and formation of the gate electrode 32, or subsequent thereto, such as by a self-aligned implantation method, as known in the art. Thereafter, the semiconductor device 10 may be further processed as appropriate to the fabrication scheme of which the process of the present invention is a part, as shown in the final step of FIG. 6.

INDUSTRIAL APPLICABILITY

According to the present invention, formation of the interfacial layer by laser excitation enables the high-K dielectric material layer to be formed on a silicon, polysilicon or polysilicon-germanium substrate, without oxidation of the silicon, polysilicon or polysilicon-germanium by the high-K dielectric material or by the process of forming the high-K dielectric material and without degradation of the high-K dielectric material. Thus, a distinct, defect-free interface may be formed between these layers, which avoids leakage currents and other problems which may occur when a high-K dielectric material is formed directly on a silicon, polysilicon or polysilicon-germanium substrate, by conventional methods. The interfacial layer provides a barrier at the interface between the possibly-reactive layers, thus avoiding the undesirable effects which could result from the reaction, and avoiding a significant loss of the K-value of the high-K dielectric material which might result from use of a thicker barrier layer, or from uncontrolled oxidation of the silicon, polysilicon or polysilicon-germanium substrate.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A process for fabricating a semiconductor device having a high-K dielectric layer over a silicon substrate, comprising:

growing on the silicon substrate an interfacial layer of a silicon-containing dielectric material; and depositing on the interfacial layer a layer comprising at least one high-K dielectric material, wherein the interfacial layer is grown by laser excitation of the silicon substrate in the presence of oxygen, nitrous oxide, nitric oxide, ammonia or a mixture of two or more thereof, and wherein the high-K dielectric material comprises at least one of hafnium oxide($HfO_2$), zirconium oxide ($ZrO_2$), tantalum oxide($Ta_2O_5$), barium titanate ($BaTiO_3$), titanium dioxide($TiO_2$), cerium oxide ($CeO_2$), lanthanum oxide($La_2O_3$), lead titanate ($PbTiO_3$), silicon titanate($SrTiO_3$), lead zirconate ($PbZrO_3$), tungsten oxide($WO_3$), yttrium oxide ($Y_2O_3$), bismuth silicon oxide($Bi_1Si_2O_{12}$), barium strontium titanate(BST)($Ba_{1-x}Sr_xTiO_3$), PMN ($PbMg_xNb_{1-x}O_3$), PZT($pbZr_xTi_{1-x}O_3$), PZN ($PbZn_xNb_{1-x}O_3$), and PST ($PbSc_xTa_{1-x}O_3$).

2. The process of claim 1, wherein the silicon-containing dielectric material is silicon dioxide, silicon nitride, silicon oxynitride or a mixture thereof.

3. The process of claim 1, wherein the laser excitation uses a laser operating in the ultraviolet wavelength range.

4. The process of claim 1, wherein the layer of high-K dielectric material is deposited by ALCVD, RTCVD or MOCVD.

5. The process of claim 1, flier comprising depositing on the layer of high-K dielectric material an interfacial barrier layer of a dielectric material.

6. The process of claim 5, wherein the interfacial barrier layer comprises a dielectric material comprising aluminum oxide, silicon oxynitride, silicon nitride or mixtures thereof.

7. The process of claim 5, wherein the interfacial barrier layer is deposited by ALCVD, RTCVD or MOCVD.

8. The process of claim 5, further comprising depositing a polysilicon or polysilicon-germanium layer over the interfacial barrier layer.

9. A process for fabricating a semiconductor device having a high-K dielectric layer over a silicon substrate, comprising:

growing on the silicon substrate an interfacial layer of a dielectric material comprising silicon dioxide, silicon nitride, silicon oxynitride or a mixture thereof; and depositing on the interfacial layer by ALCVD, RTCVD or MOCVD a layer comprising at least one high-K dielectric material, wherein the interfacial layer is grown by laser excitation of the silicon substrate in the presence of oxygen, nitrous oxide, nitric oxide, ammonia or a mixture of two or more thereof, and wherein the high-K dielectric material comprises at least one of hafnium oxide($HfO_2$), zirconium oxide ($ZrO_2$), tantalum oxide($Ta_2O_5$), barium titanate ($BaTiO_3$), titanium dioxide($TiO_2$), cerium oxide ($CeO_2$), tantalum oxide($La_2O_3$), lead titanate($PbTiO_3$), silicon titanate($SrTiO_3$), lead zirconate($PbZro_3$), tungsten oxide($WO_3$) yttrium oxide ($Y_2O_3$), bismuth silicon oxide($Bi_1Si_2O_{12}$), barium strontium titanate(BST) ($Ra_{1-x}Sr_xTiO_3$), PMN($PbMg_xNb_{1-x}O_3$), PZT ($PbZr_xTi_{1-x}O_3$), PZN($PbZn_xNb_{1-x}O_3$), and PST ($PbSc_xTa_{1-x}O_3$).

10. The process of claim 9, wherein the laser excitation uses a laser operating in the ultraviolet wavelength range.

11. The process of claim 9, further comprising depositing on the layer of high-K dielectric material an interfacial barrier layer of a dielectric material.

12. The process of claim 11, wherein the interfacial barrier layer comprises a dielectric material comprising aluminum oxide, silicon oxynitride, silicon nitride or mixtures thereof.

13. The process of claim 11, wherein the interfacial barrier layer is deposited by ALCVD, RTCVD or MOCVD.

14. The process of claim 11, further comprising depositing a polysilicon or polysilicon-germanium layer over the interfacial barrier layer.

15. A process for fabricating a semiconductor device having a high-K dielectric layer over a silicon substrate, comprising:

growing on the silicon substrate an interfacial layer of a dielectric material comprising silicon dioxide, silicon nitride, silicon oxynitride or a mixture thereof;

depositing on the interfacial layer by ALCVD, RTCVD or MOCVD a layer comprising at least one high-K dielectric material;

depositing on the layer comprising at least one high-K dielectric material an interfacial barrier layer; and forming a gate electrode on the interfacial barrier layer, wherein the interfacial layer is grown by laser excitation of the silicon substrate in the presence of oxygen, nitrous oxide, nitric oxide, ammonia or a mixture of two or more thereof, and wherein the high-K dielectric material comprises at least one of hafnium oxide($HfO_2$), zirconium oxide ($ZrO_2$), tantalum oxide($Ta_2O_5$), barium titanate ($BaTiO_3$), tanium dioxide($TiO_2$), cerium oxide($CeO_2$), lanthanum oxide($La_2O_3$), lead titanate($PbTiO_3$), silicon titanate($SrTiO_3$), lead zirconate($PbZrO_3$), tungsten oxide($WO_3$), yttrium oxide($Y_2O_3$), bismuth silicon oxide($Bi_1Si_2O_{12}$), barium strontium titanate(BST) ($Ba_{1-x}Sr_xTiO_3$), PMN($PbMg_xNb_{1-x}O_3$), PZT ($PbZr_xTi_{1-x}O_3$), PZN($PbZn_xNb_{1-x}O_3$), and PST ($PbSc_xO_3$).

16. The process of claim 15, wherein the interfacial barrier layer comprises a dielectric material comprising aluminum oxide, silicon oxynitride, silicon nitride or mixtures thereof.

17. The process of claim 16, wherein the interfacial barrier layer is deposited by ALCVD, RTCVD or MOCVD.

18. The process of claim 15, wherein the laser is an ultraviolet laser.

* * * * *

UNITED STATES PATENT AND TRADEMARK OFFICE

CERTIFICATE OF CORRECTION

PATENT NO. : 6,682,973 B1 
DATED : January 27, 2004
INVENTOR(S) : Paton et al.

It is certified that error appears in the above-identified patent and that said Letters Patent is hereby corrected as shown below:

<u>Title page, Item [54] and Column 1, line 2,</u>
Title, replace "SIO, SIN, SION" with -- SiO, SiN, SiN, SiON --.

<u>Column 9,</u>
Line 7, replace "XeCI" with -- XeCl --.

<u>Column 10,</u>
Line 67, replace "$Zro_2$" with -- $ZrO_2$ --.

<u>Column 11,</u>
Line 3, replace "a" with -- another --.
Line 4, replace "$Zro_2$" with -- $ZrO_2$ --.

<u>Column 14,</u>
Line 29, replace "$pbZr_xTi_{1-x}O_3$" with -- $PbZr_xTi_{1-x}O_3$ --.
Line 39, replace "flier" with -- further --.

<u>Column 15,</u>
Line 1, replace "tantalum" with -- lanthanum --.
Line 2, replace "$PbZro_3$" with -- $PbZrO_3$ --.

<u>Column 16,</u>
Line 15, replace "$Bi_1Si_2O_{12}$" with -- $Bi_4Si_2O_{12}$ --.
Line 18, replace "$PbSc_xO_3$" with -- $PbSc_x Ta_{1-x}O_3$ --.

Signed and Sealed this

Thirteenth Day of April, 2004

JON W. DUDAS
*Acting Director of the United States Patent and Trademark Office*